United States Patent
(12) United States Patent
Vummidi Murali

(10) Patent No.: US 12,743,133 B2
(45) Date of Patent: Sep. 22, 2026

(54) PACKAGES AND PROCESSES FOR RADIO FREQUENCY MITIGATION AND SELF-TEST

(71) Applicant: Apple Inc., Cupertino, CA (US)

(72) Inventor: Krishna Prasad Vummidi Murali, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 561 days.

(21) Appl. No.: 18/359,298

(22) Filed: Jul. 26, 2023

(65) Prior Publication Data

US 2024/0094779 A1 Mar. 21, 2024

Related U.S. Application Data

(60) Provisional application No. 63/376,424, filed on Sep. 20, 2022.

(51) Int. Cl.
*G06F 1/16* (2006.01)
*G01R 31/28* (2006.01)

(52) U.S. Cl.
CPC ....... *G06F 1/1656* (2013.01); *G01R 31/2827* (2013.01)

(58) Field of Classification Search
CPC .... G06F 1/1656; G06F 11/27; G01R 31/2827
See application file for complete search history.

(56) References Cited

U.S. PATENT DOCUMENTS

| | | | | |
|---|---|---|---|---|
| 8,099,062 | B1 * | 1/2012 | Terrovitis | H04B 1/48 455/84 |
| 8,712,324 | B2 | 4/2014 | Corbridge et al. | |
| 8,836,535 | B2 * | 9/2014 | Zhang | A61B 5/0013 340/286.07 |
| 9,479,818 | B2 | 10/2016 | Muterspaugh et al. | |
| 9,947,985 | B2 | 4/2018 | Solomko et al. | |
| 10,762,755 | B2 | 9/2020 | Mcqueen et al. | |
| 10,771,024 | B2 | 9/2020 | Zampardi et al. | |
| 10,897,236 | B2 | 1/2021 | Yu et al. | |
| 10,951,177 | B1 | 3/2021 | Montgomery | |
| 12,309,614 | B1 * | 5/2025 | Chen | H04W 16/14 |
| 2002/0071325 | A1 * | 6/2002 | Hii | G11C 29/16 714/E11.169 |
| 2014/0321018 | A1 * | 10/2014 | Beutel | G01R 31/2827 361/91.1 |

(Continued)

*Primary Examiner* — Md K Talukder
(74) *Attorney, Agent, or Firm* — Kubota & Basol LLP

(57) ABSTRACT

A semiconductor component package includes circuitry that can be used both for mitigating radio-frequency interference of signals in the package and for performing self-test procedures of components in the package. The circuitry includes chokes between the I/O pads of the package and a sensor module in the package to attenuate high-frequency RF interference in the package and protect sensors in the package. Each I/O pad may have a corresponding choke. During a self-test procedure, such as a test of a sensor's temperature coefficient of offset, the chokes can be decoupled from the I/O pads and the sensor module and coupled between a current source and a ground. A current can be supplied to the choke to raise the temperature of the package. The chokes may use high-resistance windings to increase heat generation during the self-test procedure.

17 Claims, 6 Drawing Sheets

(56) References Cited

U.S. PATENT DOCUMENTS

2015/0133064 A1* 5/2015 Horne .................. H04B 1/0458
455/77
2016/0054762 A1* 2/2016 Garelli .................. G06F 1/1656
361/679.55
2017/0237469 A1* 8/2017 Taghivand ............... H04B 5/79
455/41.1
2019/0097539 A1* 3/2019 Bucheru ............. H02M 3/3353
2021/0072176 A1* 3/2021 Han ....................... G01N 27/07
2022/0407575 A1* 12/2022 Ramasamy ............ H04B 7/082
2023/0258759 A1* 8/2023 Wang .................... G01S 5/0036
455/456.1
2023/0268650 A1* 8/2023 Swartz ............... H01Q 15/0086
455/411
2024/0031823 A1* 1/2024 Duan .................... G01S 13/765
2024/0094779 A1* 3/2024 Vummidi Murali .. G06F 1/1656
2024/0406752 A1* 12/2024 Coskun ................... H04W 4/02

* cited by examiner

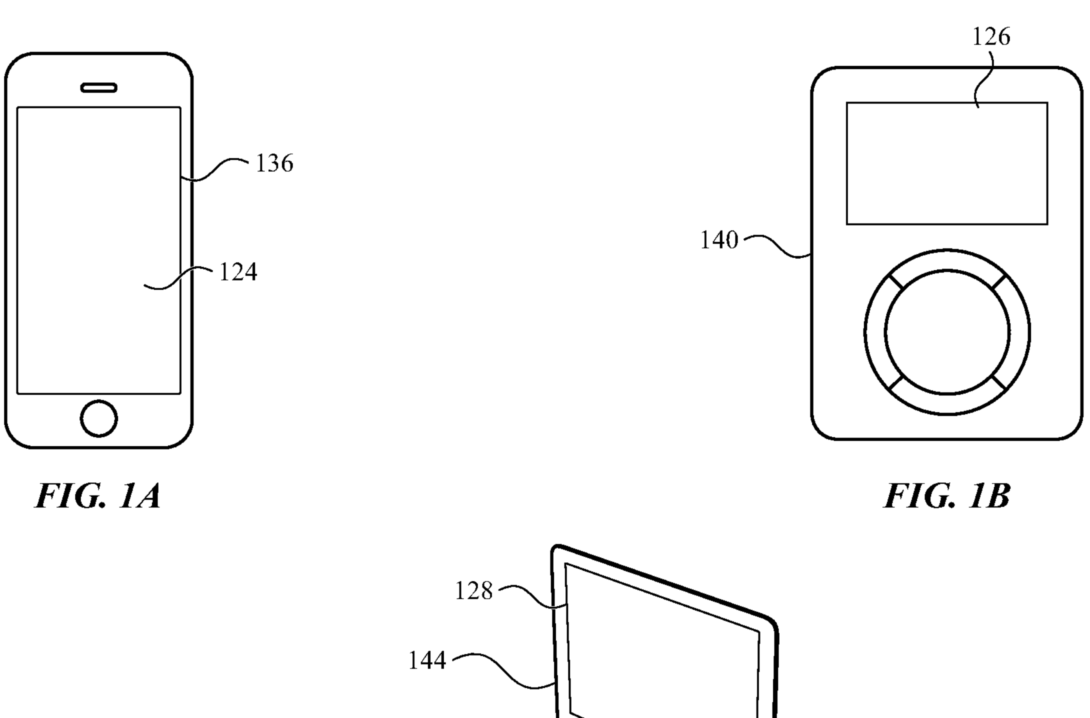
FIG. 1A
FIG. 1B
FIG. 1C
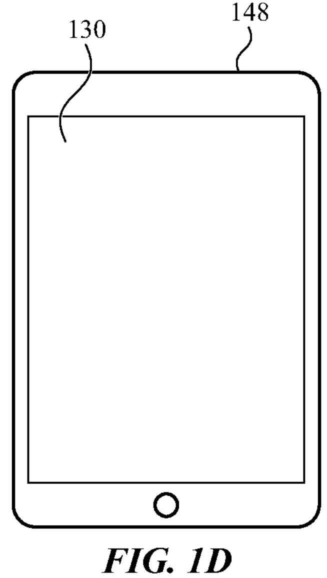
FIG. 1D
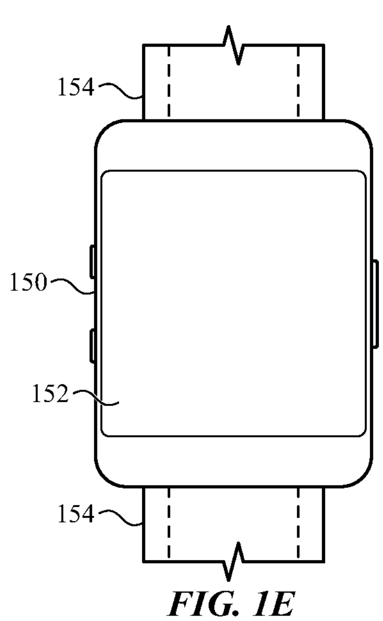
FIG. 1E

PACKAGES AND PROCESSES FOR RADIO FREQUENCY MITIGATION AND SELF-TEST

CROSS-REFERENCE TO RELATED APPLICATIONS

This application claims the benefit of U.S. Provisional Application No. 63/376,424, filed Sep. 20, 2022, the content of which is herein incorporated by reference in its entirety for all purposes.

FIELD OF THE DISCLOSURE

This relates generally to semiconductor component packages and processes for mitigating radio-frequency (RF) interference experienced by components in the package, and more particularly to packages and processes that enable some of the same circuitry in the package to be used for both RF mitigation and self-test procedures.

BACKGROUND OF THE DISCLOSURE

Many types of devices, such as smart phones, include antennas for transmitting and receiving RF signals. Such devices may include various other components, such as sensors, that may be sensitive to RF interference. Thus, it may be desirable to mitigate the RF interference with sensitive components.

SUMMARY OF THE DISCLOSURE

Some embodiments of the disclosure relate to packages and processes that may be used to improve the RF immunity of components in the package while also enabling self-test procedures. In some embodiments, RF mitigation circuitry may be included within the package, such as by including one or more chokes within the package to improve the RF immunity of circuitry or components within the package. The chokes may be coupled to input/output (I/O) pads on the package to filter RF interference in I/O signals. The chokes may also be used for enabling self-test procedures, such as by selectively coupling the chokes with a current source during a self-test procedure to raise the temperature of the package.

BRIEF DESCRIPTION OF THE DRAWINGS

FIGS. 1A-1E illustrate example systems that can include a package for RF mitigation and self-test according to examples of the disclosure.

DETAILED DESCRIPTION

Figure 2:
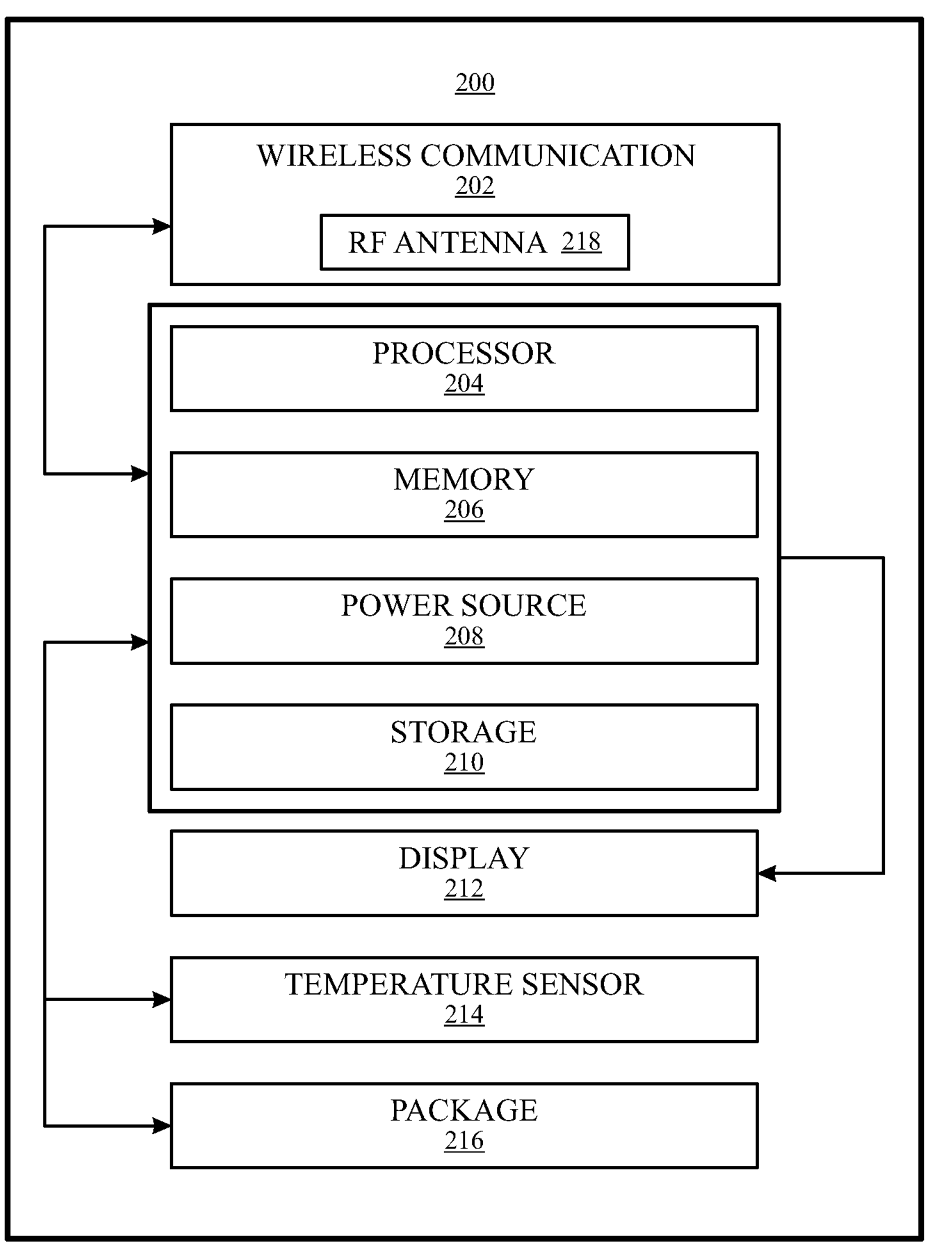
FIG. 2 illustrates a block diagram of an example electronic device that can include a package for RF mitigation and self-test according to examples of the disclosure.

In the following description of embodiments, reference is made to the accompanying drawings which form a part hereof, and in which it is shown by way of illustration specific embodiments that can be practiced. It is to be understood that other embodiments can be used, and structural changes can be made without departing from the scope of the disclosed embodiments.

This relates to packages and processes that may be used to improve the RF immunity of components in the package while also enabling self-test procedures. In general, a package may include a casing or housing that encloses one or more semiconductor components and/or integrated circuits. A package may also include one or more conductive pads for electrically connecting the package with external (outside the package) components or circuitry, such as other components or circuitry on a printed circuit board (PCB) to which the package is connected. A package may protect components and circuitry inside the package from impacts and/or from environmental exposure, for example. As described herein, components and other circuitry within a package may be configured to mitigate RF interference of signals in the package and enable self-test procedures. It should be understood, however, that such components and/or circuitry could be used for similar purposes without being enclosed in the same package.

Various electronic devices, such as cell phones, laptop computers, and other devices, may include one or more RF antennas for receiving and transmitting RF signals. Such antennas may be used to enable cellular wireless communications, for example. To keep up with the increasing demands of modern communication standards, such as 4G and 5G, RF antennas included in electronic devices have become increasingly powerful, and thus have become increasingly likely to cause RF interference with nearby components and signals or to cause more interference. Such components may include, for example, sensing devices or other components that are sensitive to RF interference. Thus, it may be desirable to mitigate RF interference that may affect various components in the package. One approach is to add RF mitigation circuitry (such as an inductive choke) outside of the package, but this approach may be relatively more expensive and may consume relatively more area compared with implementation of the RF mitigation circuitry within the package. As will be discussed herein, another approach is to use RF mitigation circuitry within the package, such as using one or more chokes within the package to improve the RF immunity of circuitry or components within the package. In some cases, such an approach may be less expensive and more space efficient (e.g., in terms of the use of circuit board area).

In some cases, it may also be desirable to enable self-test procedures for components within a package to enable the package to test its own functionality or performance. Self-test procedures may be procedures that a package (or components in the package) is able to perform using circuitry within the package.

For example, some sensors may need to be calibrated to determine their temperature coefficient of offset (TCO), which may require the sensor to be heated to characterize the effect of temperature variations on the sensor. As another example, it may be desirable to raise the temperature of the package to test the functioning of other aspects of the package (or of components near the package), such as various features or components that are designed to help dissipate heat or cool the package. For example, it may be desirable to determine whether an external port of electronic device is blocked and impeding airflow, which may cause reduced heat dissipation.

One approach to support such test procedures is to use components outside of the package to heat the package. This approach does not enable self-test procedures, however, as external devices are required to heat the package to perform the procedure. As will be described herein, by adding switching circuitry and a current source to the package, chokes used within the package to mitigate RF interference may also be used to raise the temperature of the package to enable self-test procedures, thereby providing an additional advantage with minimal added cost and complexity.

FIGS. 1A-1E illustrate examples of systems, optionally with touch screens (e.g., capacitive touch screens), that can include an example package for RF mitigation and self-test procedures according to examples of the disclosure. FIG. 1A illustrates an example mobile telephone 136 that optionally includes a touch screen 124 and can include a package for RF immunity and self-test according to examples of the disclosure. FIG. 1B illustrates an example digital media player 140 that optionally includes a touch screen 126 and can include a package for RF immunity and self-test according to examples of the disclosure. FIG. 1C illustrates an example personal computer 144 that optionally includes a touch screen 128 and can include a package for RF immunity and self-test according to examples of the disclosure. FIG. 1D illustrates an example tablet computing device 148 that optionally includes a touch screen 130 and can include a package for RF immunity and self-test according to examples of the disclosure. FIG. 1E illustrates an example wearable device 150 (e.g., a watch) that optionally includes a touch screen 152 and can include a package for RF immunity and self-test according to examples of the disclosure. Wearable device 150 can be coupled to a user via strap 154 or any other suitable fastener.

It should be understood that the devices illustrated in FIGS. 1A-1E are provided by way of example, and other devices can include a package for RF immunity and self-test according to examples of the disclosure. Additionally, although the devices illustrated in FIGS. 1A-1E include touch screens, in some embodiments, the devices may have a non-touch-sensitive display or no display.

FIG. 2 illustrates a block diagram of an example electronic device 200, according to examples of the disclosure. The electronic device 200 can include a package for RF mitigation that can be used to mitigate RF interference with components in the package and to perform self-test procedures, such as TCO self-testing. The electronic device 200 can be included in, for example, mobile telephone 136, digital media player 140, personal computer 144, tablet computing device 148, wearable device 150, or any mobile or non-mobile computing device.

FIG. 2 depicts example components that may be included in electronic device 200; the actual physical locations of components in electronic device 200 relative to each other and to a housing of electronic device 200 may differ from the locations depicted in FIG. 2.

In some embodiments, the electronic device 200 can include an integrated display 212 (e.g., a touch screen) to display images and to detect touch and/or proximity (e.g., hover) events from an object (e.g., active or passive stylus or finger) at or proximate to the surface of the display 212.

In some embodiments, the electronic device 200 can include a power source 208 (e.g., energy storage device such as a battery), processor 204, program storage 210 (e.g., a program storage device) and/or memory 206, wireless communication circuitry 202, a temperature sensor 214, and a package 216 for RF mitigation and self-test. The processor 204 can control some or all of the operations of the electronic device 200. The processor 204 can communicate, either directly or indirectly, with some or all of the other components of the electronic device 200. For example, a system bus or other communication mechanism can provide communication between the power source 208, the processor 204, the display 212, the program storage 210, the memory 206, the wireless communication circuitry 202, temperature sensor 214, and the package 216. Thus, in some embodiments, the package 216 may be coupled with the processor 204 via one or more routing traces (e.g., conductive signal paths).

The processor 204 can be implemented as any electronic device capable of processing, receiving, or transmitting data or instructions, whether such data or instructions is in the form of software or firmware or otherwise encoded. For example, the processor 204 can include a microprocessor, a central processing unit (CPU), an application-specific integrated circuit (ASIC), a digital signal processor (DSP), a controller, or a combination of such devices. As described herein, the term "processor" or "processing circuitry" is meant to encompass a single processor or processing unit, multiple processors, multiple processing units, or other suitably configured computing element or elements. In some embodiments, processor 204 can provide part or all of the processing systems or processors described with reference to any of FIGS. 3-7.

The processor 204 can receive touch input to the display 212 or other input devices and perform actions based on the outputs. For example, the processor 204 can be connected to the program storage 210 (and/or memory 206) and a display controller/driver to generate images on the display 212. The display 212 can include, but is not limited to, Liquid Crystal Display (LCD) displays, Light-Emitting Diode (LED) displays, including Organic LED (OLED), Active-Matrix Organic LED (AMOLED), Passive-Matrix Organic LED (PMOLED) displays, a projector, a holographic projector, a retinal projector, or other suitable display. In some embodiments, the display driver can provide voltages on select (e.g., gate) lines to each pixel transistor and can provide data signals along data lines to these same transistors to control the pixel display image for the display 212.

The processor 204 can cause an image to be displayed on the display 212, such as an image of a user interface (UI), and can use a touch processor and/or a touch controller to detect a touch on or near the display 212, such as a touch input to the displayed UI when the electronic device 200 includes a touch screen. The touch input can be used by computer programs stored in program storage 210 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. The processor 204 can also perform additional functions that may not be related to touch processing, such as functions related to mitigating RF interference and conducting self-test procedures.

Note that one or more of the functions described in this disclosure can be performed by firmware stored in memory 206 and/or stored in program storage 210 and executed by the processor 204 or other processing circuitry of the electronic device 200. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some embodiments, the program storage 210 and/or memory 206 can be a non-transitory computer readable storage medium. The non-transitory computer readable storage medium (or multiple thereof) can have stored therein instructions, which when executed by the processor 204 or other processing circuitry, can cause the device including the computing electronic device 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

The power source 208 can be implemented with any device capable of providing energy to the electronic device 200. For example, the power source 208 can include one or more batteries or rechargeable batteries. Additionally or alternatively, the power source 208 can include a power connector or power cord that connects the electronic device 200 to another power source, such as a wall outlet.

The memory 206 can store electronic data that can be used by electronic device 200. For example, memory 206 can store electrical data or content such as, for example, audio and video files, documents and applications, device settings and user preferences, timing signals, control signals, and data structures or databases. The memory 206 can include any type of memory. By way of example only, the memory 206 can include random access memory, read-only memory, Flash memory, removable memory, other types of storage elements, or combinations of such memory types.

Wireless communication circuitry 202 can transmit or receive data from another electronic device. Although wireless communication circuitry 202 is illustrated and described, it is understood that wired communication interfaces may also be used. In some embodiments, the wireless and/or wired communications interfaces can include, but are not limited to, cellular, Bluetooth, and/or Wi-Fi communications interfaces. In some embodiments, wireless communication circuitry 202 can include an RF antenna 218 for receiving and transmitting RF signals, such as cellular telecommunication signals. Wireless communication circuitry 202 may also include one or more additional antennas for receiving and transmitting Bluetooth, Wi-Fi, or other types of wireless signals. In some embodiments, RF antenna 218 may be located in relatively close physical proximity to additional circuitry in electronic device 200 that may be sensitive to RF interference, such as a sensing device or other components.

As described herein, package 216 may include one or more sensing devices, such as a pressure sensor, temperature sensor, and/or another type(s) of sensor, and additional circuitry for mitigating RF interference with the sensing device(s) and supporting self-test procedures. Package 216 is described in more detail with reference to FIGS. 3-7.

Although not shown, the electronic device 200 can also include other input/output mechanisms including one or more touch sensing input surfaces, a crown, one or more physical buttons, one or more microphones or speakers, one or more ports such as a microphone port, and/or a keyboard.

It should be apparent that the architecture shown in FIG. 2 is only one example architecture of the electronic device 200 and that the device could have more or fewer components than shown, or a different configuration of components. The various components shown in FIG. 2 can be implemented in hardware, software, firmware, or any combination thereof, including one or more signal processing and/or application specific integrated circuits (ASICs).

Figure 3:
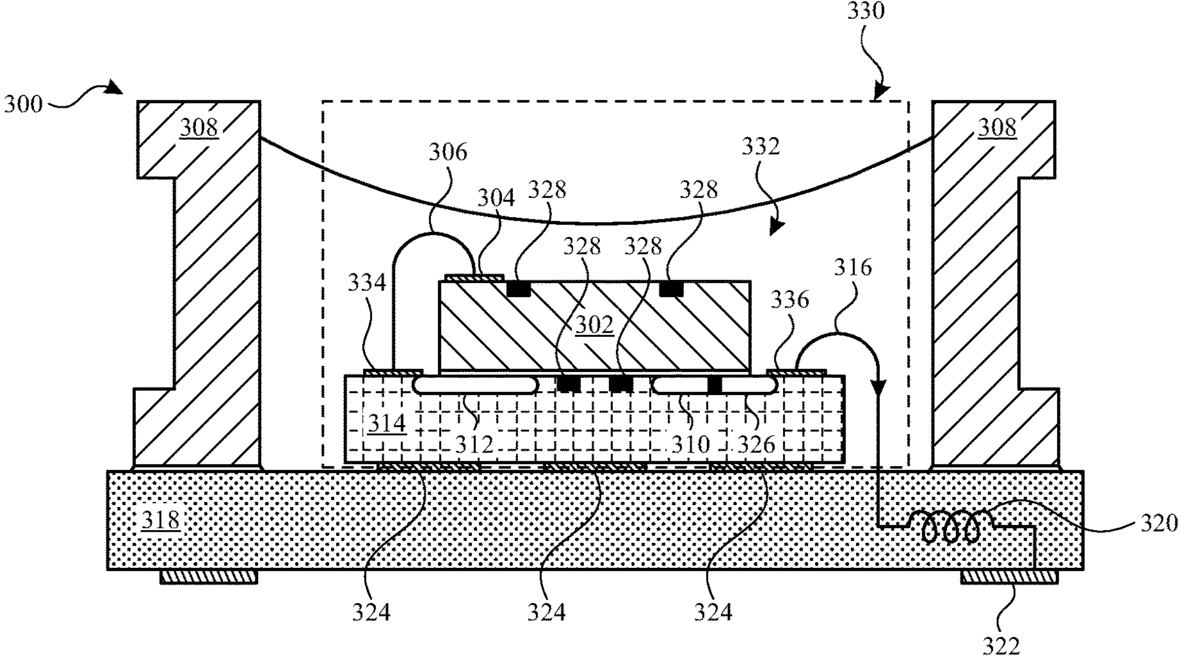
FIG. 3 illustrates a cross-sectional view of an example package for RF mitigation and self-test.

FIG. 3 illustrates a cross-section of a package 300 for RF mitigation and self-test. Package 300 includes a sensing device 302. Sensing device 302 can include sensor circuitry configured to sense one or more types of parameters, such as but not limited to, pressure, temperature, humidity, vibration; light; touch; force; heat; movement; relative motion; biometric data (e.g., biological parameters) of a user; air quality; proximity; position; connectedness; and so on. In some embodiments, sensing device 302 can include a pressure transducer, a temperature sensor, a force sensor, a heat sensor, a position sensor, a light or optical sensor, an accelerometer, a gyroscope, an acoustic sensor, a health monitoring sensor, and/or an air quality sensor, among other possibilities. In some embodiments, the sensing device 302 can include an image sensor such as an outward facing camera, an infrared sensor (and/or transmitter), a magnetic sensor (and/or generator) (e.g., a magnetometer), an ultrasonic sensor (and/or transmitter), and/or an inertial measurement unit. Additionally, sensing device 302 can utilize any suitable sensing technology, including, but not limited to, micro-electro-mechanical systems (MEMS)-based, interferometric, magnetic, capacitive, ultrasonic, resistive, optical, acoustic, piezoelectric, or thermal technologies.

In some embodiments, sensing device 302 may use an external port of the electronic device to sense one or more types of parameters. For example, if sensing device 302 is a pressure transducer, sensing device 302 may detect pressure waves propagated through a port of the electronic device that is open to the atmosphere outside of the electronic device. Thus, in some embodiments, sensing device 302 may be located adjacent to a housing of the electronic device and may be located above (as viewed looking down into the port) other circuitry in package 300.

In some embodiments, package 300 include an integrated circuit 314. Integrated circuit 314 may include an analog front end (AFE) 312 for receiving analog signals from sensing device 302 (such as a voltage or current representing a pressure or other parameter) and converting them to digital signals. Integrated circuit 314 may also include digital input/output (I/O) circuitry 310 for receiving and transmitting digital signals from/to external components or devices (such as processor 204 shown in FIG. 2), and a current source 326 for supplying a current (e.g., to a choke), among other circuitry or components. In some embodiments, integrated circuit 314 may be or may include an ASIC, a field-programmable gate array (FPGA), or another type of circuit.

Integrated circuit 314 and sensing device 302 may each include one or more temperature sensors 328 for sensing temperature(s) at one or more locations of package 300. For example, one or more temperature sensors 328 may be used to sense a temperature of one or more locations in package 300 during or after a self-test procedure, or at other times. In some embodiments, one or more temperature sensors 328 may be used as part of a closed-loop feedback control system during a self-test procedure. For example, the self-test procedure may be terminated (e.g., ceased) when a temperature sensed by one or more temperature sensors 328 reaches a threshold, or when an average temperature sensed by the one or more temperature sensors 328 reaches a threshold. One or more temperature sensors 328 may also be used to monitor a temperature of electronic device 200 while it is not performing a self-test, such as while integrated circuit 314 is receiving or transmitting digital I/O signals.

Integrated circuit 314 may be electrically coupled with sensing device 302. For example, sensing device 302 may include one or more pads 304 that may be coupled with one or more corresponding pads 334 on integrated circuit 314 via one or more conductive elements, such as one or more wires 306. That is, in some embodiments, sensing device 302 may be wire-bonded (e.g., with one or more wire-bonds) to integrated circuit 314. Additionally or alternatively, other types of electrical connections may be used to electrically couple sensing device 302 with integrated circuit 314.

Sensing device 302, integrated circuit 314, and the electrical connections between them (e.g., pads 334, 304, wire 306) may be collectively referred to as a sensor module 330. Package 300 may, optionally, include enclosure 308 that encloses at least a portion of sensor module 330 (e.g., a portion of sensor module 330 that excludes a bottom surface of sensor module 330) for protecting sensor module 330 from external contaminants. A surface of the enclosure 308 (e.g., a bottom surface) may be in contact with the substrate 318 (e.g., enclosure 308 may be glued or otherwise attached to substrate 318). In some embodiments, enclosure 308 is filled with a gel 332, such as a silicon gel. That is, gel 332 may be disposed in enclosure 308 and may be in contact with some or all of the enclosed portion of sensor module 330. Gel 332 may be used to prevent dust or other materials from contacting sensing device 302. For example, if sensing device 302 is a pressure sensor that is ported outside of electronic device 200 to enable sensing device 302 to sense pressure waves (e.g., sound waves) outside of electronic device 200, gel 332 may enable propagation of the pressure waves to sensing device 302 (through gel 332) while preventing dust or other materials from contacting sensing device 302. In other embodiments, package 300 may not include enclosure 308 or gel 332.

Package 300 may include substrate 318. Substrate 318 may be a substrate upon which integrated circuit 314 and/or sensing device 302 may be formed or fabricated. Integrated circuit 314 may be electrically coupled with substrate 318. For example, integrated circuit 314 may include one or more pads 336 and wire(s) 316 that electrically couple integrated circuit 314 to a one or more pads 336 of substrate 318 to enable signals, such as I/O signals, to be transmitted between integrated circuit 314 and substrate 318. That is, integrated circuit 314 may be wire-bonded to substrate 318 using one or more wire-bond connections. In some embodiments, substrate 318 may be a ceramic substrate, or may be formed of a different material such as silicon.

Substrate 318 may include one or more chokes 320. A choke 320 may be a type of inductor that is designed to attenuate RF interference in signals, such as by attenuating the high-frequency alternating current (A/C) portion of signals, such as signals in the range of 0.5-8 GHz. In some embodiments, one or more chokes 320 can be located in or along one or more respective routing traces (e.g., signal paths) between sensor module 330 and external components (such as processor 204) to mitigate RF interference in the signal paths. For example, a choke may be used to attenuate relatively high-frequency A/C signals that may arise in a signal path due to RF interference caused by either an RF antenna located inside the electronic device or by a nearby RF antenna. In this manner, a choke 320 may be used to protect sensitive components in package 300, such as sensing device 302, from the effects of RF interference.

In some embodiments, a choke 320 may include a ferrite core having an insulated metallic wire wrapped around the core. In some embodiments, the wire wrapped around the core may be formed of a high-resistivity metal, such as tungsten, to increase resistive losses when a current is supplied to choke 320, thereby causing a temperature of package 300 to rise during, for example, a self-test procedure in which a current is supplied to the choke 320. In some embodiments, the choke 320 may include a wire having a resistivity of at least $4\times10^{-8}$ ohms/meter at 20C. In some embodiments, the choke 320 may include a wire having a resistivity between $3\times10^{-8}$ ohms/meter and $8\times10^{-8}$ ohms/meter at 20C.

Package 300 may be electrically coupled with a circuit board (not shown), such as a printed circuit board (PCB), to enable components in package 300 to exchange signals with various other components outside of package 300 that may be electrically coupled with the circuit board. Such components may include a processor (such as processor 204 shown in FIG. 2).

Sensor module 330 may be coupled with a processor, such as processor 204, using one or more routing traces to enable sensor module 330 and the processor to communicate with each other. A routing trace may be a conductive signal path used for exchanging various signals between sensor module 330 and the processor. A routing trace between sensor module 330 and the processor may include wire 316 between pad 336 and sensor module 330, for example.

In some embodiments, an electronic device containing package 300 (such as electronic device 200) or package 300 itself may be configured to operate in a first mode of operation or a second mode of operation. In the first mode, package 300 may be configured to receive and transmit digital signals from/to a processor (such as processor 204), with one or more chokes 320 coupled between sensor module 330 and one or more corresponding I/O pads 322, such as shown in FIG. 3. In the first mode of operation, package 300 may be configured to receive and transmit I/O signals through one or more chokes 320 to attenuate RF interference in the I/O signals. In the second mode of operation, package 300 may be configured to perform a self-test procedure. In the second mode of operation, one or more chokes 320 may be coupled between a current source 326 and a ground (not shown). The current source 326 may supply a DC current to the one or more chokes 320 to cause the temperature of package 300 to rise (due to resistive losses in the one or more chokes 320). In some examples, while operating in the second mode of operation, the one or more chokes may be uncoupled from the digital I/O circuitry and may, optionally, be uncoupled from the respective one or more I/O pads 322 and may therefore not be configured to receive I/O signals on the one or more I/O pads 322. In other examples, the one or more chokes 320 may be coupled with the one or more I/O pads 322 regardless of whether the electronic device is operating in the first mode or the second mode.

Figure 6:
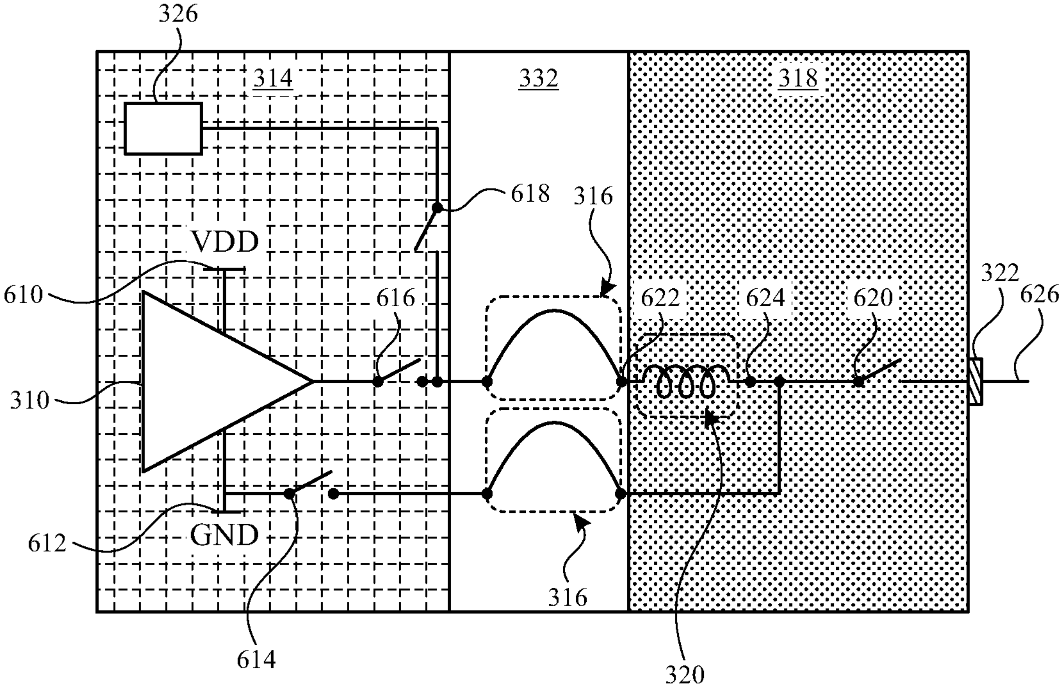
FIG. 6 illustrates circuitry in an example package for RF mitigation and self-test.

Additional circuitry that may be used to configure package 300 in the first mode of operation or the second mode of operation is depicted in FIG. 6.

Figure 4:
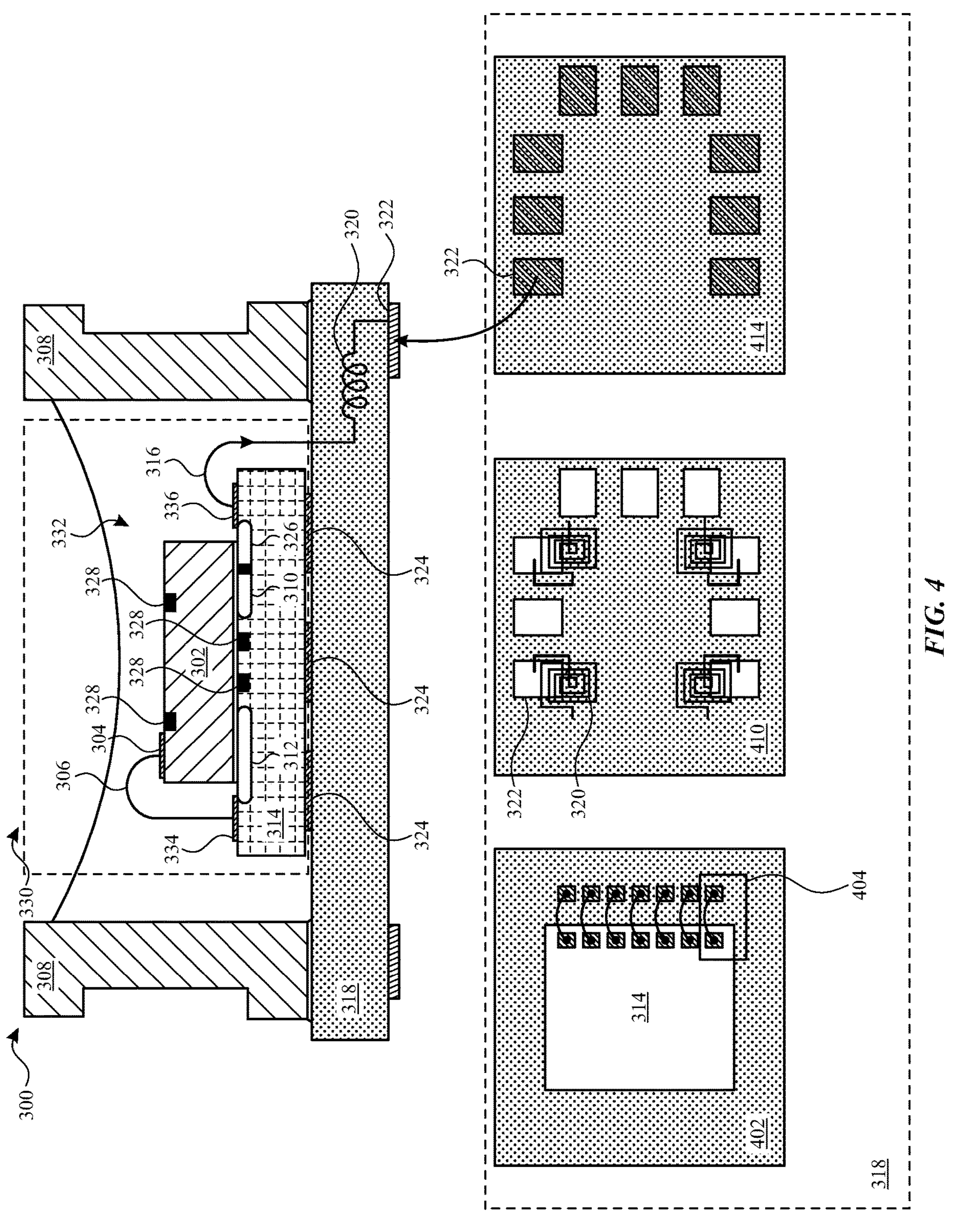
FIG. 4 illustrates views of a substrate of an example package for RF mitigation and self-test.

FIG. 4 illustrates views of an example substrate of a package for RF mitigation and self-test.

FIG. 4 depicts a top portion 402 of substrate 318 underneath integrated circuit 314. As previously discussed, the top portion of substrate 318 is coupled with integrated circuit 314 using one or more electronical connections, such as wire bonds 404. Additionally or alternatively, other types of electrical connections may be used between substrate 318 and integrated circuit 314.

FIG. 4 also depicts a middle portion 410 of substrate 318. Middle portion 410 includes one or more chokes 320, each of which can be electrically coupled with a corresponding I/O pad 322 and wire bond 404. When the electronic device or package 300 is operating in the first mode of operation (e.g., receiving or transmitting digital I/O signals), the one or more chokes 320 may be coupled between corresponding I/O pads 322 and sensor module 330 (e.g., via wire bonds 404) to mitigate RF interference with the digital I/O signals received or transmitted via the one or more I/O pads 322.

FIG. 4 also depicts a bottom portion 414 of substrate 318, which may include the surface of I/O pads 322 (e.g., the surface to which other components may be electrically connected). Although FIG. 4 depicts substrate 318 in three portions for clarity, in practice substrate 318 may be fabricated in two or more layers.

Figure 5:
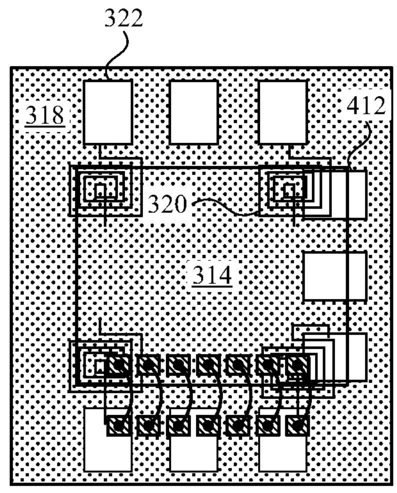
FIG. 5 illustrates views of an example package for RF mitigation and self-test.

FIG. 5 illustrates a top view of an example substrate of a package for RF mitigation and self-test, with all three portions of substrate 318 (e.g., as shown in FIG. 4) overlaid. In the embodiment depicted in FIG. 5, substrate 318 has nine pads, of which four are I/O pads 322. Each I/O pad 322 may have a corresponding choke 320 for attenuating RF interference in signals received or transmitted from the respective I/O pad 322. In some embodiments, substrate 318 includes one choke 320 for each I/O pad 322 to enable RF mitigation of all I/O signals received or transmitted by package 300. Pads that are not used for I/O signals may not have corresponding chokes. In some embodiments, each I/O pad 322 is coupled with a choke 320 without intervening switching circuitry; that is, each I/O pad 322 may be permanently coupled with a corresponding I/O pad. In other embodiments, each I/O pad 322 can be coupled with a choke 320 via switching circuitry (such as shown in FIG. 6), which may enable each I/O pad to be coupled or uncoupled from the corresponding choke 320 based on whether the electronic device or package 300 is operating in the first mode of operation (e.g., receiving and transmitting signals via I/O pads 322 through one or more chokes 320) or in the second mode of operation (e.g., performing a self-test by supplying a DC current to one or more chokes 320).

In some embodiments, a processor (such as processor 204) may be configured to determine that a self-test procedure is to be initiated, such as by receiving a signal indicating a self-test procedure is to be initiated. In accordance with the determination that the self-test procedure is to be initiated, the processor may select a set of chokes of the one or more chokes to be used during the self-test procedure. For example, the processor may select all or a subset of the one or more chokes 320 in substrate 318 to use in the self-test procedure based on various criteria. Such criteria may include, for example, how much heat needs to be generated for the self-test procedure (e.g., based on a target temperature of a location in the package 300 or elsewhere in the electronic device), or based on how quickly the heat needs to be generated for the self-test procedure (e.g., based on a target duration of the self-test procedure), or on a combination of these and/or other factors. After selecting the set of chokes to be used in the self-test procedure, the processor may cause switching circuitry to couple each choke of the selected set of chokes between the current source 326 and a ground and cause the current source to initiate a supply of a direct current (DC) current to each choke of the selected set of chokes. The processor may then obtain a temperature at one or more locations on the electronic device using one or more sensors.

In some embodiments, the processor may be configured to select the value of the DC current (e.g., a DC value in terms of amps) to be supplied to the set of chokes and cause the current source 326 to supply a DC current having the DC value to the set of chokes. A higher DC value may cause the package or other areas of the electronic device to heat up more quickly and/or to achieve a higher temperature, for example. The processor may select the DC value based on similar criteria as described earlier with respect to selecting the set of chokes. That is, the processor may select the DC value based on a target temperature of the package or other areas of the electronic device, a target duration of the self-test procedure, or a combination of these and/or other factors.

In some embodiments, the processor may be configured to terminate the self-test procedure when one or more criteria are satisfied. For example, the processor may be configured to terminate the self-test procedure by causing the current source to cease supplying the DC current to the set of chokes, causing the switching circuitry to uncouple each choke of the set of chokes from the current source and the ground, and causing the switching circuitry to couple each choke of the set of chokes between digital I/O circuitry and a respective I/O pad of the one or more I/O pads.

The one or more criteria that may be used by the processor to determine when to terminate the self-test procedure may include a criterion that is satisfied when a pre-determined time duration has elapsed after initiating the self-test procedure (e.g., an elapsed time after entering the second mode of operation or supplying the DC current), or after one or more temperatures at one or more locations on the electronic device have reached a threshold (e.g., indicating that the package has been sufficiently heated), or a combination of these and possibly other considerations.

FIG. 6 illustrates example circuitry that may be included in a package for RF mitigation and self-test. In some embodiments, a package (such as package 300 depicted in FIG. 3) may include switching circuitry, such as switches 616, 614, 618 and (optionally) switch 620 and/or other types of switching circuitry, to couple one or more chokes 320 between a current source 326 (e.g., a current source 326 that is coupled with a voltage supply node 610 and a ground 612) and the ground 612 or between one or more I/O pads 322 and a digital I/O circuitry 310 in a sensor module (such as sensor module 330). The switching circuitry may include, for example, a first switch 618 for coupling a first node 622 of choke 320 with current source 326, and a second switch 614 for coupling a second node 624 of choke 320 with a ground 612. The switching circuitry may include a third switch 616 for coupling the first node 622 of one or more chokes 320 with a digital I/O circuitry 310 in sensor module 330, and optionally a fourth switch 620 for coupling the second node 624 of one or more chokes 320 with a respective I/O pad 322. The I/O pad 322 may be coupled with a processor (such as processor 204) by one or more routing traces 626. Thus, in some embodiments, a routing trace between a processor and an integrated circuit 314 in a sensor module may include routing trace 626, wire 316, and additional (unlabeled) conductive wiring between I/O pad 322 and digital I/O circuitry 310.

Although a single choke and associated switching circuitry are shown in FIG. 6, it should be understood that a package or electronic device can include one or more chokes 320 with associated switching circuitry. Each choke may have its own switching circuitry such that it can be independently controlled, or the same switching circuitry may be shared by multiple chokes.

The switching circuitry may be configured to, in a first mode of operation, couple the one or more chokes 320 between the digital I/O circuitry 310 of sensor module 330 and a processor (such as processor 204) in the path of one or more routing traces, such as by opening switches 618, 614 and closing switch 616 (and switch 620, if present).

The switching circuitry may be configured to, in a second mode of operation (e.g., a self-test mode), couple the one or more chokes 320 between a current source 326 and a ground 612, such as by opening switch 616 (and switch 620, if present) and closing switches 614 and 618.

In some embodiments, a processor (such as processor 204) may be configured to cause the switching circuitry to couple the one or more chokes 320 between either the current source 326 and the ground 612 or between respective one or more I/O pads 322 and digital I/O circuitry 310 of the sensor module by causing various switches 614, 616, 618, 620 to open or close, thereby causing the electronic device to operate in the first mode or the second mode.

In some embodiments, a processor may be configured to determine that a self-test procedure is to be initiated, such as by receiving a signal indicating a self-test procedure is to be initiated. In accordance with the determination that the self-test procedure is to be initiated, the processor may select a set of chokes of the one or more chokes 320 to be used during the self-test procedure. For example, the processor may select all or a subset of the one or more chokes 320 in substrate 318 to use in the self-test procedure based on various criteria. Such criteria may include, for example, how much heat needs to be generated for the self-test procedure (e.g., based on a target temperature of a location in the package 300 or elsewhere in the electronic device), or based on how quickly the heat needs to be generated for the self-test procedure (e.g., based on a target duration of the self-test procedure), or based on a combination of these and/or other factors. After selecting the set of chokes to be used in the self-test procedure, the processor may cause switching circuitry (e.g., switches 614, 616, 618, 620) to couple each choke of the selected set of one or more chokes 320 between the current source 326 and a ground and cause the current source 326 to initiate a supply of a direct current (DC) current to each choke of the selected set of chokes. The processor may then obtain a temperature at one or more locations on the electronic device using one or more sensors.

In some embodiments, the processor may be configured to select the value of the DC current (e.g., a current value in terms of amps) to be supplied to the set of one or more chokes 320, and cause the current source 326 to supply a DC current having the DC current value to the set of one or more chokes 320. A higher DC current value may cause the package 300 or other areas of the electronic device to heat up more quickly and/or to achieve a higher temperature, for example. The processor may select the DC current value based on similar criteria as described earlier with respect to selecting the set of chokes. That is, the processor may select the DC current value based on a target temperature of a location in the package or in other areas of the electronic device, a target duration of the self-test procedure, or a combination of these and/or other factors.

In some embodiments, the processor may be configured to terminate the self-test procedure when one or more criteria are satisfied. For example, the processor may be configured to terminate the self-test procedure by causing the current source 326 to cease supplying the DC current to the set of chokes 320, causing the switching circuitry to uncouple each choke of the set of chokes from the current source 326 and the ground, and causing the switching circuitry to couple each choke of the set of chokes with a respective I/O pad 322 of the one or more I/O pads 322.

The one or more criteria that may be used by the processor to determine when to terminate the self-test procedure may include a criterion that is satisfied when a pre-determined time duration has elapsed after initiating the self-test procedure (e.g., an elapsed time after entering the second mode of operation or supplying the DC current), or after one or more temperatures at one or more locations on the electronic device have reached a threshold (e.g., indicating that the package has been sufficiently heated), or a combination of these and possibly other considerations.

Figure 7:
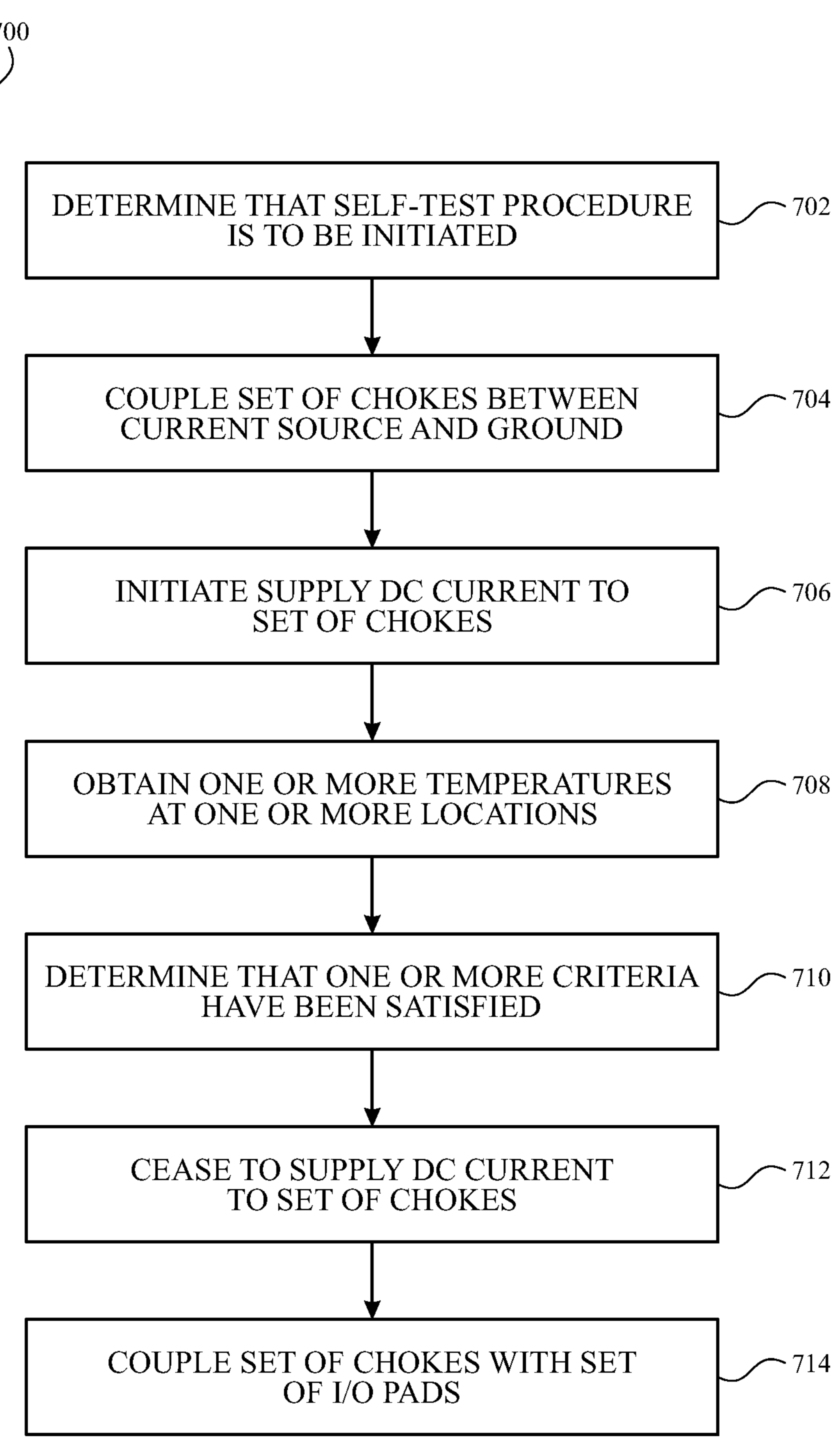
FIG. 7 illustrates a process for mitigating RF interference and performing a self-test according to some examples of the disclosure.

FIG. 7 illustrates an example process 700 for performing a self-test procedure and mitigating RF interference using a package for RF mitigation and self-test. Process 700 may be performed by an electronic device, such as electronic device 200.

At block 702, the electronic device can determine that a self-test procedure is to be initiated. In some embodiments, a processor (such as processor 204) in the electronic device can determine that a self-test procedure is to be initiated based on receiving a signal indicating that a self-test procedure is to be initiated.

At block 704, the electronic device can couple a set of chokes of one or more chokes in a package of the electronic device between a current source and a ground. In some embodiments, the electronic device includes switching circuitry that is configured to couple the set of chokes between the current source and the ground during a second mode of operation, such as during a self-test procedure. In some embodiments, a processor of electronic device is configured to cause the switching circuitry to couple the set of one or more chokes between the current source and the ground.

At block 706, the electronic device can initiate a supply of a direct current (DC) current to the set of chokes. In some embodiments, a processor of the electronic device is configured to cause the current supply to initiate supply of the DC current, such as by sending a signal to a sensor module in the electronic device.

At block 708, the electronic device can obtain one or more temperatures at one or more locations of the electronic device. In some embodiments, a processor of the electronic device is configured to obtain the one or more temperatures using one or more temperature sensors in the device, such as temperature sensors 328 depicted in FIG. 3.

At block 710, the electronic device can determine that one or more criteria have been satisfied after initiating supply of the DC current to the set of chokes. The one or more criteria can include, for example, a criterion that is satisfied when at least one of the one or more temperatures obtained in block 708 reaches a threshold, or when a pre-determined amount of time has elapsed after initiating the supply of the DC current, or a combination of these and possibly other factors.

At block 712, the electronic device can, in accordance with a determination that one or more criteria have been satisfied after initiating the supply of the DC current to the set of chokes, cease to supply the DC current to the set of chokes. In some embodiments, a processor in the electronic device may cause the current source to cease to supply the DC current to the set of chokes, such as by sending a signal to the current source or to the sensor module.

At block 714, the electronic device can uncouple the set of chokes from the current source and the ground. In some embodiments, a processor in the electronic device can cause switching circuitry in the package to uncouple the set of chokes from the current source and the ground, such as by sending a signal to the switching circuitry or to the sensor module.

At block 716, the electronic device can couple the set of chokes between digital I/O circuitry and a respective set of I/O pads of the one or more I/O pads. In some embodiments, a processor in the electronic device can cause switching circuitry in the package couple the set of chokes between the digital I/O circuitry and the respective set of I/O pads of the one or more I/O pads, such as by sending a signal to the switching circuitry or to the sensor module.

Therefore, according to the above, some examples of the disclosure are directed to an electronic device. The electronic device can comprise: a sensor module comprising a sensing device; a processor couplable to the sensor module using one or more routing traces; one or more chokes, each choke of the one or more chokes associated with a respective routing trace of the one or more routing traces; and switching circuitry, the switching circuitry configured to: in a first mode of operation, couple the one or more chokes between the sensor module and the processor in a path of the one or more routing traces, and in a second mode of operation, couple a set of chokes of the one or more chokes between a current source and a ground.

Additionally or alternatively to one or more of the examples disclosed above, in some examples, the electronic device can include a substrate that is electrically coupled between the sensor module and the processor, the substrate comprising the one or more chokes and at least a portion of each of the one or more routing traces.

Additionally or alternatively to one or more of the examples disclosed above, in some examples, the sensor module comprises analog-to-digital circuitry coupled with the sensing device for receiving analog signals from the sensing device and converting the analog signals into digital signals to be transmitted on at least one of the one or more routing traces; and the current source.

Additionally or alternatively to one or more of the examples disclosed above, in some examples, the switching circuitry is configured to in the second mode of operation, uncouple the set of chokes from the sensor module.

Additionally or alternatively to one or more of the examples disclosed above, in some examples, in the second mode of operation, the processor is configured to select the set of chokes based on a target temperature, a target elapsed time, or a combination thereof.

Additionally or alternatively to one or more of the examples disclosed above, in some examples, the processor is configured to, in the second mode of operation, select a direct current (DC) value and cause the current source to supply a DC current having the DC value to the set of chokes.

Additionally or alternatively to one or more of the examples disclosed above, in some examples, the processor is configured to select the DC value based on a target temperature, a target elapsed time, or a combination thereof.

Additionally or alternatively to one or more of the examples disclosed above, in some examples, the processor is configured to cause the electronic device to enter the second mode of operation in response to a determination that a self-test procedure is to be initiated.

Additionally or alternatively to one or more of the examples disclosed above, in some examples, the electronic device comprises one or more input/output (I/O) pads, and the processor is configured to: in the second mode of operation, after the switching circuitry couples the set of chokes between the current source and the ground, determine that one or more criteria are satisfied, and in accordance with the determination that the one or more criteria are satisfied, cause the electronic device to enter the first mode of operation by causing the switching circuitry to uncouple the set of chokes from the current source and the ground and coupling the set of chokes between the sensor module and respective I/O pads of the one or more I/O pads.

Additionally or alternatively to one or more of the examples disclosed above, in some examples, the one or more criteria include a first criterion that is satisfied when a pre-determined time duration has elapsed after entering the first mode of operation.

Additionally or alternatively to one or more of the examples disclosed above, in some examples, the electronic device comprises a temperature sensor for determining a temperature at a location of the electronic device.

Additionally or alternatively to one or more of the examples disclosed above, in some examples, the one or more criteria include a second criterion that is satisfied when the temperature at the location of the electronic device reaches a threshold.

Additionally or alternatively to one or more of the examples disclosed above, in some examples, the substrate is a ceramic substrate.

Additionally or alternatively to one or more of the examples disclosed above, in some examples, the sensing device comprises a pressure sensor configured to detect an air pressure outside of the electronic device.

Additionally or alternatively to one or more of the examples disclosed above, in some examples, the sensing device comprises a temperature sensor, a humidity sensor, or an accelerometer.

Additionally or alternatively to one or more of the examples disclosed above, in some examples, at least one of the one or more chokes comprises insulated wiring wound around a core and configured to attenuate alternating current (AC) signals.

Additionally or alternatively to one or more of the examples disclosed above, in some examples, the wiring is formed of a high-resistivity metal having a resistance of at least $4\times10-8$ ohms/meter at 20C.

Additionally or alternatively to one or more of the examples disclosed above, in some examples, the wiring comprises tungsten.

Additionally or alternatively to one or more of the examples disclosed above, in some examples, the electronic device comprises an enclosure to enclose at least a portion of the sensor module, where a surface of the enclosure is in contact with the substrate; and a gel disposed inside the enclosure and in contact with at least part of the enclosed portion of the sensor module.

Additionally or alternatively to one or more of the examples disclosed above, in some examples, the electronic device comprises a radio frequency (RF) antenna.

Some examples of the disclosure are directed to an electronic device. The electronic device can comprise: a temperature sensor; a current source; digital input/output (I/O) circuitry; a processor in communication with the current source and the temperature sensor; a substrate coupled with the processor, the substrate comprising one or more chokes and one or more input/output (I/O) pads, each choke associated with a corresponding I/O pad of the one or more I/O pads; first switching circuitry between each of the one or more chokes and the current source; and second switching circuitry between each of the one or more chokes and the digital I/O circuitry, where the processor is configured to, in accordance with a determination that a self-test procedure is to be initiated: select a set of chokes of the one or more chokes based on one or more first criteria, cause the first switching circuitry to couple each choke of the set of chokes between the current source and a ground, cause the current source to initiate a supply of a direct current (DC) current to each choke of the set of chokes, and obtain, based on causing the current source to initiate the supply of the DC current, a temperature at a location on the device using the temperature sensor.

Additionally or alternatively to one or more of the examples disclosed above, in some examples, the processor is further configured to: in accordance with a determination that one or more second criteria have been satisfied while the DC current is supplied to the set of chokes: cause the current source to cease supplying the DC current to each choke of the set of chokes, cause the first switching circuitry to uncouple each choke of the set of chokes from the current source and the ground, and cause the second switching circuitry to couple each choke of the set of chokes between the digital I/O circuitry and the respective I/O pads.

Additionally or alternatively to one or more of the examples disclosed above, in some examples, the one or more second criteria include a first criterion that is satisfied when an elapsed time of the self-test procedure reaches a pre-determined time duration, when the temperature at the location on the device reaches a target temperature, or a combination thereof.

Additionally or alternatively to one or more of the examples disclosed above, in some examples, the one or more first criteria include a second criterion that is satisfied when a pre-determined time duration has elapsed, when the temperature at the location on the device reaches a threshold, or a combination thereof.

Additionally or alternatively to one or more of the examples disclosed above, in some examples, the processor is configured to, before causing the current source to initiate the supply of the DC current, select a DC value, and the processor is configured to cause the current source to initiate the supply of the DC current by causing the current source to initiate the supply of the DC current having the DC value.

Additionally or alternatively to one or more of the examples disclosed above, in some examples, the electronic device comprises a sensor module, the sensor module comprises the current source, and a sensing device separate from the temperature sensor.

Additionally or alternatively to one or more of the examples disclosed above, in some examples, the sensing device comprises a pressure sensor configured to detect an air pressure outside of the electronic device.

Additionally or alternatively to one or more of the examples disclosed above, in some examples, the electronic device comprises a substrate, where the substrate comprises: the one or more chokes; and the one or more I/O pads.

Additionally or alternatively to one or more of the examples disclosed above, in some examples, each choke of the one or more chokes comprises tungsten wiring wrapped around a core.

Some examples of the disclosure are directed to a method performed at an electronic device comprising a processor, a sensing device, one or more temperature sensors, one or more input/output (I/O) pads, digital I/O circuitry, a current source, and one or more chokes. The method can include: in accordance with a determination that a self-test procedure is to be initiated: coupling a set of chokes of the one or more chokes between the current source and a ground, initiating a supply of a direct current (DC) current to the set of chokes, and obtaining, after initiating the supply of the DC current to the set of chokes, one or more temperatures at one or more locations of the electronic device, and in accordance with a determination that one or more criteria have been satisfied after initiating the supply of the DC current to the set of chokes: ceasing to supply the DC current to the set of chokes, uncoupling the set of chokes from the current source and the ground, and coupling the set of chokes between the digital I/O circuitry and a respective set of I/O pads of the one or more I/O pads.

Additionally or alternatively to one or more of the examples disclosed above, in some examples, the method comprises receiving, by the digital I/O circuitry from the processor, a first signal from a first I/O pad of the set of I/O pads after coupling the set of chokes between the digital I/O circuitry and the respective set of I/O pads.

Additionally or alternatively to one or more of the examples disclosed above, in some examples, the method comprises transmitting, to the processor from the first I/O pad, a second signal obtained from the sensing device after coupling the set of chokes between the digital I/O circuitry and the respective set of I/O pads.

Additionally or alternatively to one or more of the examples disclosed above, in some examples, the one or more criteria include a first criterion that is satisfied when at least one of the one or more temperatures reaches a threshold, or when a pre-determined time duration has elapsed after initiating the supply of the DC current to the set of chokes, or a combination thereof.

Additionally or alternatively to one or more of the examples disclosed above, in some examples, the method comprises: in accordance with the determination that the self-test procedure is to be initiated, selecting the set of chokes based on a target temperature, a pre-determined time duration, or a combination thereof.

Additionally or alternatively to one or more of the examples disclosed above, in some examples, the method comprises: in accordance with the determination that the self-test procedure is to be initiated, selecting a value of the DC current based on a target temperature, a pre-determined time duration, or a combination thereof, and initiating the supply of the DC current comprises initiating supply of the selected value of the DC current.

Additionally or alternatively to one or more of the examples disclosed above, in some examples, the set of chokes comprises a single choke, and the respective set of I/O pads comprises a single I/O pad.

Some examples of the disclosure are directed to a non-transitory computer storage medium storing instructions that, when executed by one or more processors included in an electronic device comprising a sensing device, one or more temperature sensors, digital I/O circuitry, one or more input/output (I/O) pads, a current source, and one or more chokes, cause the one or more processors to perform any of the methods described above.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. An electronic device, comprising:
- a sensor module comprising a sensing device;
- a processor couplable to the sensor module using one or more routing traces;
- one or more chokes, each choke of the one or more chokes associated with a respective routing trace of the one or more routing traces;
- switching circuitry, wherein the switching circuitry is configured to:
  - in a first mode of operation, couple the one or more chokes between the sensor module and the processor in a path of the one or more routing traces, and
  - in a second mode of operation, couple a set of chokes of the one or more chokes between a current source and a ground; and
- one or more input/output (I/O) pads, wherein the processor is configured to:
  - in the second mode of operation, after the switching circuitry couples the set of chokes between the current source and the ground, determine that one or more criteria are satisfied, and
  - in accordance with the determination that the one or more criteria are satisfied, cause the electronic device to enter the first mode of operation by causing the switching circuitry to uncouple the set of chokes from the current source and the ground and coupling the set of chokes between the sensor module and respective I/O pads of the one or more I/O pads.

2. The electronic device of claim 1, further comprising:
- a substrate electrically coupled between the sensor module and the processor, the substrate comprising the one or more chokes and at least a portion of each of the one or more routing traces.

3. The electronic device of claim 1, wherein the sensor module comprises:
- analog-to-digital circuitry coupled with the sensing device for receiving analog signals from the sensing device and converting the analog signals into digital signals to be transmitted on at least one of the one or more routing traces; and
- the current source.

4. The electronic device of claim 1, wherein the switching circuitry is configured to:
- in the second mode of operation, uncouple the set of chokes from the sensor module.

5. The electronic device of claim 1, wherein, in the second mode of operation, the processor is configured to select the set of chokes based on a target temperature, a target elapsed time, or a combination thereof.

6. The electronic device of claim 1, wherein the processor is configured to, in the second mode of operation, select a direct current (DC) value and cause the current source to supply a DC current having the DC value to the set of chokes.

7. The electronic device of claim 1, wherein the processor is configured to cause the electronic device to enter the second mode of operation in response to a determination that a self-test procedure is to be initiated.

8. The electronic device of claim 1, wherein the one or more criteria include a first criterion that is satisfied when a pre-determined time duration has elapsed after entering the first mode of operation.

9. The electronic device of claim 1, further comprising a temperature sensor for determining a temperature at a location of the electronic device, wherein the one or more criteria include a second criterion that is satisfied when the temperature at the location of the electronic device reaches a threshold.

10. The electronic device of claim 1, wherein the sensing device comprises a pressure sensor configured to detect an air pressure outside of the electronic device, a temperature sensor, a humidity sensor, or an accelerometer.

11. The electronic device of claim 1, wherein at least one of the one or more chokes comprises insulated wiring wound around a core and configured to attenuate alternating current (AC) signals.

12. The electronic device of claim 1, further comprising a radio frequency (RF) antenna.

13. The electronic device of claim 2, further comprising:
- an enclosure to enclose at least a portion of the sensor module, wherein a surface of the enclosure is in contact with the substrate; and
- a gel disposed inside the enclosure and in contact with at least part of the enclosed portion of the sensor module.

14. The electronic device of claim 2, wherein the substrate is a ceramic substrate.

15. The electronic device of claim 6, wherein the processor is configured to select the DC value based on a target temperature, a target elapsed time, or a combination thereof.

16. The electronic device of claim 11, wherein the wiring is formed of a high-resistivity metal having a resistance of at least $4\times10^{-8}$ ohms/meter at 20° C.

17. The electronic device of claim 16, wherein the wiring comprises tungsten.

* * * * *